United States Patent [19]

Takemura et al.

[11] Patent Number: 5,576,556
[45] Date of Patent: Nov. 19, 1996

[54] THIN FILM SEMICONDUCTOR DEVICE WITH GATE METAL OXIDE AND SIDEWALL SPACER

[75] Inventors: Yasuhiko Takemura; Hongyong Zhang; Toshimitsu Konuma, all of Kanagawa, Japan

[73] Assignee: Semiconductor Energy Laboratory Co., Ltd., Kanagawa-ken, Japan

[21] Appl. No.: 291,028

[22] Filed: Aug. 16, 1994

Related U.S. Application Data

[63] Continuation-in-part of Ser. No. 378,316, Jan. 25, 1995, which is a continuation of Ser. No. 131,958, Oct. 8, 1993, abandoned.

[30] Foreign Application Priority Data

Aug. 20, 1993  [JP]  Japan ..................... 5-227891

[51] Int. Cl.⁶ .......................... H01L 27/092; H01L 29/04; H01L 29/786
[52] U.S. Cl. .................. 257/69; 257/66; 257/72; 257/344; 257/391; 257/408
[58] Field of Search ..................... 257/72, 66, 69, 257/344, 359, 391, 392, 408

[56] References Cited

U.S. PATENT DOCUMENTS

| | | | |
|---|---|---|---|
| 4,336,550 | 6/1982 | Medwin | 257/351 |
| 4,468,855 | 9/1984 | Sasaki | 257/368 |
| 4,554,572 | 11/1985 | Chatterjee | 257/69 |
| 4,899,202 | 2/1990 | Blake et al. | 257/336 |
| 4,923,822 | 5/1990 | Wang et al. | 257/382 |
| 5,289,030 | 2/1994 | Yamazaki et al. | 257/900 |
| 5,308,998 | 5/1994 | Yamazaki | 257/66 |
| 5,359,219 | 10/1994 | Hwang | 257/351 |

FOREIGN PATENT DOCUMENTS

| | | | |
|---|---|---|---|
| 2-96375 | 4/1990 | Japan | 257/384 |
| 4162679 | 6/1992 | Japan | 257/336 |
| 4186775 | 7/1992 | Japan | 257/72 |

OTHER PUBLICATIONS

Kistler et al, *IEEE Elec. Dev. Lettr* vol. 13 No. 5 May 1992 "Sub-Quarter-Micrometer . . . SOI".

*Primary Examiner*—Jerome Jackson, Jr.
*Attorney, Agent, or Firm*—Sixbey, Friedman, Leedom & Ferguson, P.C.; Gerald J. Ferguson, Jr.; Karlton C. Butts

[57] ABSTRACT

A monolithic circuit comprises a plurality of thin film transistors. Source and drain regions of the TFT are provided with a metal silicide layer having a relatively low resistivity. Thereby, the effective distance between a gate and a source/drain electrode can be reduced.

29 Claims, 11 Drawing Sheets

⊠ contact hole

THIN FILM SEMICONDUCTOR DEVICE WITH GATE METAL OXIDE AND SIDEWALL SPACER

This application is a continuation-in-part of Ser. No. 08/378,316, filed Jan. 25, 1995, entitled "Semiconductor Device And Method For Forming The Same", which, in turn, is a continuation of Ser. No. 08/131,958, filed Oct. 8, 1993, entitled "Semiconductor Device And Method For Forming The Same", now abandoned.

BACKGROUND OF THE INVENTION

1. Field of the Invention

The present invention relates to a process for manufacturing an insulated gate type semiconductor device on an insulating substrate (which means, throughout the specification, any substance with an insulating surface, and includes not only insulating materials such as glass, but all semiconductors, metals and other materials with an insulating layer thereon, unless otherwise indicated), and forming an integrated circuit which comprises a plurality of such devices. The semiconductor device according to the present invention may be used as a thin film transistor (TFT) for active matrixes of liquid crystal display devices, etc., driving circuits of image sensors, etc., SOI integrated circuits and conventional semiconductor integrated circuits (microprocessors, microcontrollers, microcomputers, semiconductor memories, etc.).

2. Description of the Related Art

Up to now, it is widely known that TFTs (thin film transistors) are utilized as devices integrated on glass substrates for active matrix type liquid crystal display devices, image sensors, etc. FIGS. 3(A) to 3(E) show schematic diagram of the cross section of a TFT of the prior art, and it shows an exemplary flow chart of a preparation process therefor. The one shown in FIGS. 3(A) to 3(E) is an insulated gate field effect transistor with a thin film of silicon semiconductor positioned on a glass substrate (hereunder, abbreviated to TFT). The preparation process will be explained in brief below. In FIG. 3(A), a reference numeral 301 indicates a glass substrate, and on this glass substrate 301 there is formed an underlying silicon oxide film 302 (around 2,000 Å thick) on which in turn an active layer 303 in the form of an island composed of a silicon semiconductor film is formed. This silicon semiconductor film has a thickness of approximately 500–2,000 Å, and is noncrystalline (amorphous) or crystalline (a polycrystalline, microcrystalline or the like). Formed on the active layer is a 1,000–1,500 Å thick silicon dioxide film 304 which forms a gate insulating film.

Next, a gate electrode 305 is formed with doped polycrystalline silicon, tantalum, titanium, aluminum, etc. [FIG. 3 (B)]. Further, with this gate electrode as the mask, an impurity element (phosphor or boron) is introduced by means such as ion doping, thereby forming source/drain regions (impurity regions) 306 in the active layer 303 in a self-aligning manner. The section of the active layer under the gate electrode with no impurity introduced therein is a channel-forming region 307 [FIG. 3(C)].

In addition, the doped impurity is activated with a laser, flash lamp or the like [FIG. 3(D)].

Then, a silicon oxide film is formed by means such as plasma CVD, APCVD or the like to provide an inter-layer insulator 307. Furthermore, through this layer insulator, there is formed a contact hole on the source/drain regions, and a metallic material such as aluminum is used to form a wiring/electrode 308 which connects with the source/drain [FIG. 3(E)].

For such TFTs of the prior art, it is necessary to reduce the sheet resistance for the improvement of the performance particularly, field mobility and subthreshold characteristics (S value). For the above purpose, the following three techniques have been presented.

1) The doping amount (concentration) of impurities is increased;
2) The activation energy (the intensity of the laser or the lash lamp) is increased considerably; and
3) The distance between the channel-forming region 307 and the metal electrode (z in the drawing) is shortened.

Relating to item 1), however, the increase in the doping amount causes a prolonged treatment time and results in a lower throughput, and also presents an additional problem in that the damage to the active layer and the gate insulating film 304 becomes severer. Particularly, though a method wherein a gas containing a doping element is made plasmic and accelerated for injection (ion doping or plasma doping method) is certainly excellent from the viewpoint of mass production, at the same time it has a drawback in that the accelerated ions contain many atoms of hydrogen and other elements which tends to heat the substrate in excess. This drawback becomes more notable at a higher plasma density.

Additional problems are that the elements are damaged by heating caused by doping, or the photo resist used as the mask for doping undergoes carbonization, thus becoming extremely difficult to be removed.

Also relating to item 2), the active layer and the gate electrode peel off at high energy, resulting in a lower yield of TFTs. The throughput is reduced either. For example, if a laser is employed, the energy of the laser cannot be changed considerably, and thus it becomes necessary to increase the focusing degree of the beams for a larger energy density. This inevitably leads to a reduced area of the beams which in turn results in a prolonged treatment time for the same area.

Further, item 3) above depends on the accuracy of the mask alignment, so much improvement of the characteristics cannot be expected. Particularly, in the case where a glass substrate is used as the substrate, shrinkage of the glass substrate during the heating steps (various annealing steps are required) is a serious obstacle to proper mask alignment. For example, a glass substrate over 10 cm square subjected to thermal treatment at around 500° C. readily undergoes shrinkage of around several microns. Accordingly, in practice the distance z is set to 20μm or so to leave a margin. In addition, if the value of z is small, then the parasitic capacity between the gate electrode 305 and the source/drain electrodes 308 is increased correspondingly, and this increase adversely affects the performance of the TFT.

Another drawback resides in that, for the formation of a contact hole in the source/drain regions 306, it is required to conduct a somewhat excessive etching procedure in order to ensure proper formation of the contact hole, and thus the distance denoted by z cannot be shortened indefinitely. For the foregoing reasons, it is extremely difficult to make a further reduction of the parasitic capacity of the source/drain regions of a TFT of the prior art.

SUMMARY OF THE INVENTION

The present invention is intended to solve the above problems, thereby providing a TFT with advanced characteristics, by substantially shortening the distance between the channel-forming region and the source/drain region and further reducing the resistance between them. It is another object of the invention to accomplish the above while facilitating mass production.

In accordance with the primary aspect of the invention, source and drain regions of a TFT are provided with a metal silicide layer having a relatively low resistivity. Thereby, the effective distance between a gate and a source/drain electrode can be reduced, These and other objects and features of the invention will be explained in more detail below with reference to the attached drawings.

DETAILED DESCRIPTION OF THE PREFERRED EMBODIMENTS

Figure 1A:
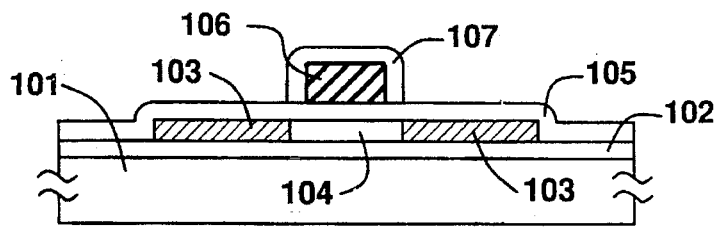
FIGS. 1(A) to 1(G) illustrate a process for the preparation of a TFT according to Example 1.

In accordance with a preferred embodiment of the invention, in a top gate-type TFT, a gate electrode is oxidized at least on its side, and preferably on both the side and the top surface, to form an oxide film thereon. This oxide film is desired to have excellent insulation characteristics. A roughly triangular insulator is formed outside the oxide of the gate electrode as a spacer. The width of this spacer is preferably 1µm or less. A silicide is formed in close contact with a source/drain region in alignment with the spacer (in a self-aligning manner). Since silicide has an exceptionally lower specific resistance than the doped polycrystalline silicon, its resistance is quite low even if it is very thin.

The metallic material used for forming the silicide is so selected that the silicide can contact the silicon semiconductor in an ohmic contact or in a near-ohmic contact. For example, the metal is molybdenum (Mo), tungsten (W), platinum (Pt), chromium (Cr), titanium (Ti), and cobalt (Co).

In carrying out the present invention, at least one of these metals is reacted with silicon to produce a silicide.

FIGS. 1(A) to 1(E) show an example embodying the above concept, which illustrates a process for the preparation of a TFT with such a configuration as discussed above. On a substrate 101, there are formed an underlying oxide film 102, source/drain regions 103, a channel-forming region 104, a gate insulating film 105, and a gate electrode 106 made of aluminum, titanium, tantalum or another metal or an alloy. Formed around the gate electrode is an oxide layer 107 thereof. Thermal oxidation or anodization is suitable for the formation of the oxide layer. Particularly, the oxide layer is preferably provided by anodization when a metal or alloy such as aluminum, titanium, or tantalum is used for the gate electrode. An impurity is doped into the semiconductor layer in a self-aligning manner with respect to the gate electrode and the oxide layer formed thereon, and thus the source/drain regions and the gate electrode are kept in an offset state [FIG. 1(A)].

For the use of anodization according to the present invention, it is important to select a proper material for the gate electrode because the material determines the type of the anodic oxide. In accordance with the present invention, the gate electrode may be composed of a pure metal such as aluminum, titanium, tantalum, silicon, an alloy produced by adding a small amount of an additive thereto (e.g., an aluminum alloy with 1–3% silicon, or a silicon alloy with 1,000 ppm - 5% phosphor), a conductive silicide such as tungsten silicide (WSi2) or molybdenum silicide (MoSi2) or a conductive nitride represented by titanium nitride. In this connection, throughout the specification unless otherwise noted, for example, "aluminum" includes not only the pure element, but also aluminum containing 10% or less of an additive. This applies to the other materials including silicon.

According to the present invention, the gate electrode may be of a monolayer configuration constructed by the use of each of those materials alone, or of a multilayer configuration composed of two or more layers thereof. For instance, it may be a two-layer configuration with tungsten silicide formed on aluminum or a two-layer configuration with aluminum formed on titanium silicide. The thickness of the respective layers may be determined by the user depending on the properties required for the device.

Then, an insulating film 108 is formed. It is important for this film to achieve excellent covering of the side of the gate electrode [FIG. 1(B)]. This insulating film is then subjected to anisotropic etching by a method such as dry etching. That is, the etching is selectively conducted only in the vertical direction. As a result, the surface of the source/drain regions is exposed, leaving a roughly triangular insulator 109 on the side of the gate electrode (which includes the surrounding oxide layer 107 as well) [FIG. 1(C)]. The remaining insulating material will function as a spacer for deciding the area where silicide layers are formed in the later step.

The size of the spacer 109, particularly its width, is determined by the thickness of the pre-formed insulating film 108, the etching conditions, and the height of the gate electrode (which also includes the surrounding oxide layer 107). The thickness of the insulating film 108 is usually around 2,000–20,000 Å, but may be determined as desired or necessary. Moreover, the shape of the resulting insulator 109 is not restricted to a triangle, and may change depending on the step coverage and the thickness of the insulating film 108. In an example where the thickness is small, it is a square shape.

Figure 1B:
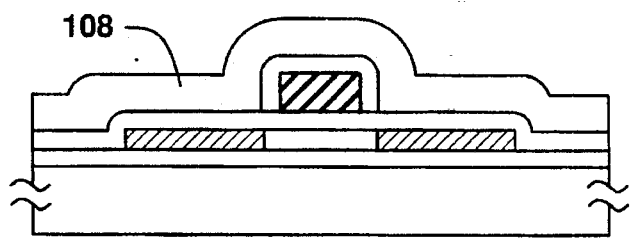
Figure 1C:
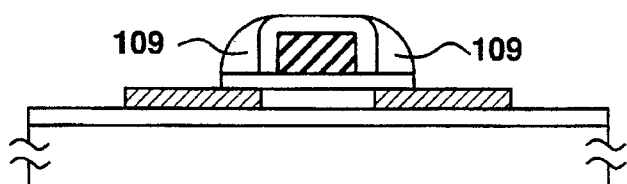
Figure 1D:
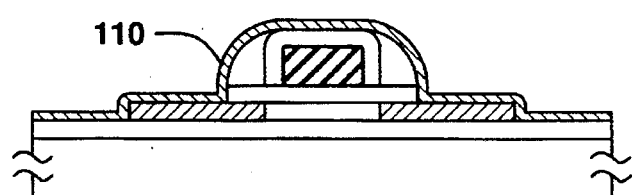

Thereafter, a film 110 of an appropriate metal, including, e.g. titanium, molybdenum, tungsten, platinum or palladium is formed on the entire surface of the substrate [FIG. 1(D)].

Then, a silicide layer is formed through the reaction of the metallic film with the silicon of the source/drain region by annealing at an appropriate temperature or annealing with a laser or a flash lamp. The metallic film is kept in a metallic state unchanged without reacting with the other materials, including, for example, silicon oxide, silicon nitride, or aluminum oxide, titanium oxide, tantalum oxide, etc. which form the oxide layer 107 of the gate electrode. Thus, the silicide and the metallic film coexist on the substrate, nevertheless, only the metallic film may be etched off selectively with an appropriate etchant. Here, it is important that the oxide layer 107 is present on the top surface of the gate electrode. This is because the oxide layer prevents direct reaction between the metallic film 110 and the gate electrode 106. Following the above procedures, the silicide layer 111 alone is left intact in close contact with the source/drain region [FIG. 1(E)].

If the metallic film is irradiated with intense light from a laser or the like for its reaction with the underlying silicon semiconductor film to produce a silicide, a pulsed laser is preferably used. With a continuous-wave laser, there is a risk that the irradiated object may expand thermally and peel off because of the prolonged irradiation time.

As the pulsed laser light, there may be used IR laser light such as Nd:YAG laser light (Q switching pulse generation type is preferred.), visible light such as the second harmonic thereof, or light from any of various types of UV lasers which utilize an excimer of KrF, XeCl, ArF or the like, though it is necessary to select a laser light having a wavelength which cannot be reflected by the metallic film if the laser irradiation is applied from above the top surface of the metallic film. This requirement is, however, not so critical if the metallic film is very thin. In addition, the laser light may be irradiated from the side of the substrate. At this time, however, it becomes necessary to select a laser light which penetrates through the underlying silicon semiconductor film.

Figure 1E:
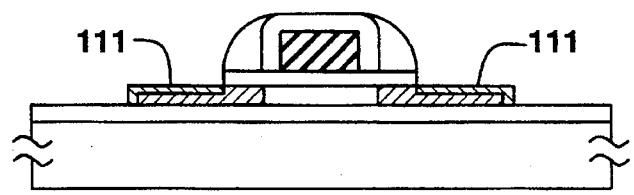
Figure 1F:
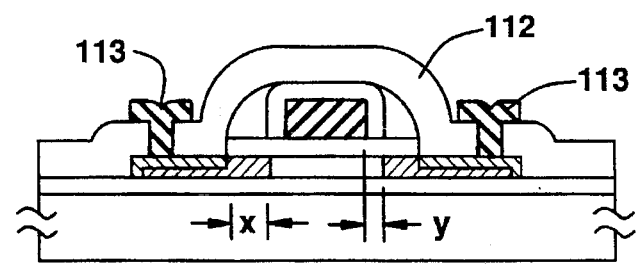
Figure 1G:
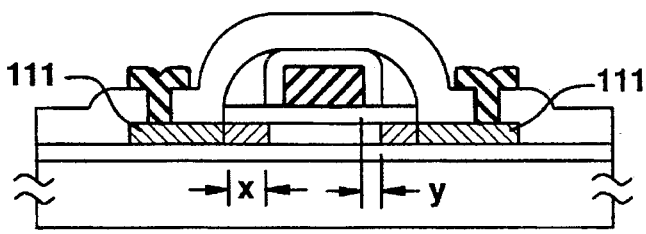

In the drawing, although the silicide layer appears thinner than the active layer, it is a matter of course that the silicide may have the same thickness as the active layer as shown in FIG. 1(G). However, regardless of the thickness of the silicide layer, the region of the active layer under the insulator 109 is composed of an impurity semiconductor which makes up the source/drain regions. The materials of the silicide layer 111 may be TiSi or TiSi$_2$ when Ti is used, MoSi2 when Mo is used, WSi$_2$ or W(SiAl)$_2$ when W is used, Ti$_7$Si$_{12}$A$_{15}$ when TiSi$_2$ is used or Pd$_4$SiA$_{13}$ when Pd$_2$Si is used. Greater preference is, however, given to the use of TiSi or TiSi$_2$ utilizing Ti takes priority from the point of view of the treatment temperature, contact resistance, and sheet resistance.

Thereafter, an inter-layer insulator 112 is formed, after which a contact hole is formed on the silicide layer 111, and a metallic electrode/wiring 113 is formed to complete the TFT [FIG. 1. (F)].

Thus, in the TFT according to the present invention, since the resistance of the silicide layer 111 is extremely small, it may be understood that the resistance between the channel-forming region and the metallic electrode is determined substantially only by the distance denoted as x in FIG. 1(F). As described above, x is preferably 1μm or less, so the resistance is markedly lowered. Of course, the distance between the contact hole and the gate electrode may be arranged according to the prior art.

Further, an offset (y in the drawing) is effective for reducing the leakage current of the TFT.

An additional preferable embodiment of the present invention will be shown in FIGS. 2(A) to 2(F). In this embodiment, on a substrate 201 there are formed an underlying oxide film 202, an active layer comprising source/drain regions 203 and a channel-forming region 204, a gate insulating film 205, a gate electrode 206 and a surrounding oxide layer 207, in the same manner as in the first. [FIG. 2(A)].

Thereafter, the gate insulating film 205 is etched in a self-aligning manner using the gate electrode and the surrounding oxide layer 207 as the mask. For example, if the oxide layer 207 consists mainly of aluminum oxide, and the main component of the gate insulating film is formed with the silicon oxide, then dry etching may be conducted using a fluorine- based (e.g., NF$_3$ or SF$_6$) etching gas. With this type of etching gas, the gate insulating film, silicon oxide, is quickly etched, whereas the etching rate of aluminum oxide is sufficiently low to enable selective etching.

Figure 2A:
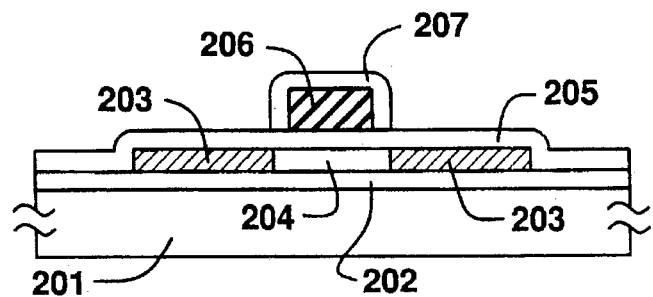
FIGS. 2(A) to 2(F) illustrate a process for the preparation of a TFT according to Example 2.
Figure 2B:
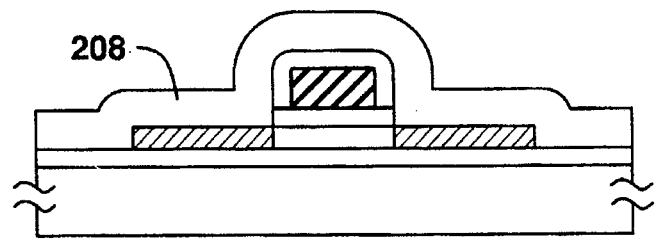

Then, an insulating film 208 is arranged on the entire surface [FIG. 2(B)].

Figure 2C:
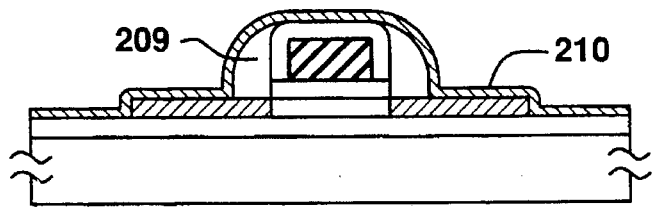

The insulating film 208 is subjected to anisotropic etching in the same manner as in FIG. 1, leaving a roughly triangular insulator 209 as a spacer on the side of the gate electrode, after which an appropriate metallic film 210 is arranged [FIG. 2(C)].

Figure 2D:
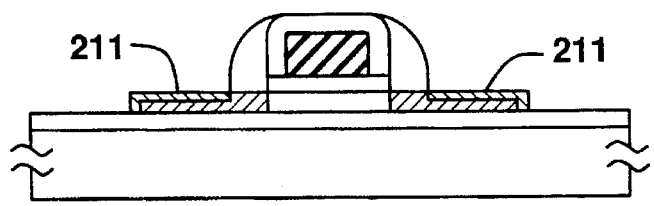

The film is then reacted with the silicon by a proper thermal treatment, irradiation with a laser, or the like, to produce a silicide layer 211 [FIG. 2(D)].

Figure 2E:
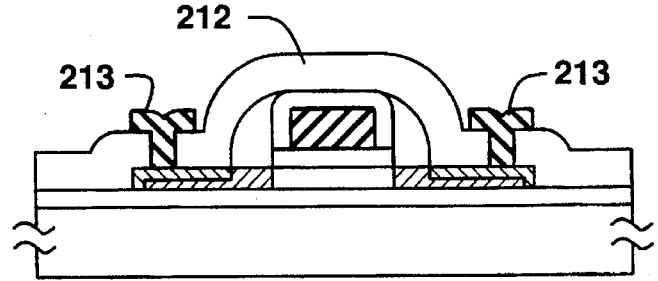

Thereafter, an inter-layer insulator 212 and a metallic electrode/wiring 213 are formed [FIG. 2(E)].

Figure 2F:
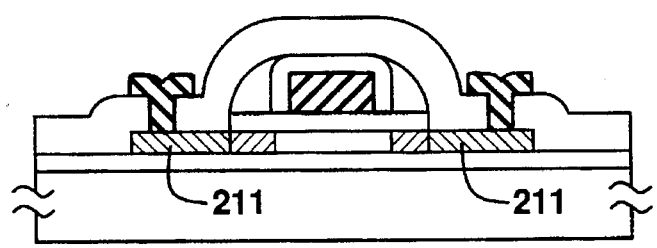
Figure 3A:
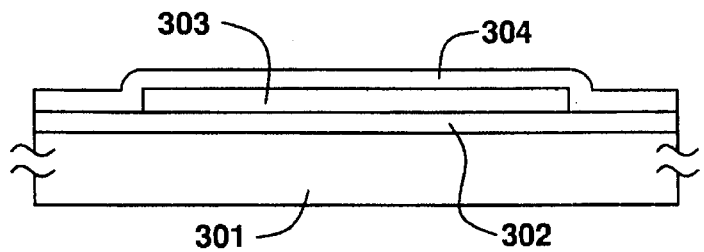
FIGS. 3(A) to 3(E) illustrate a process for the preparation of a TFT according to the prior art.
Figure 3B:
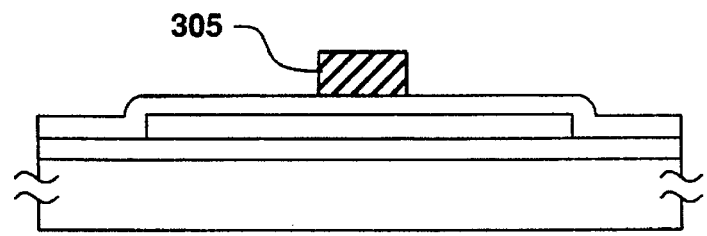
Figure 3C:
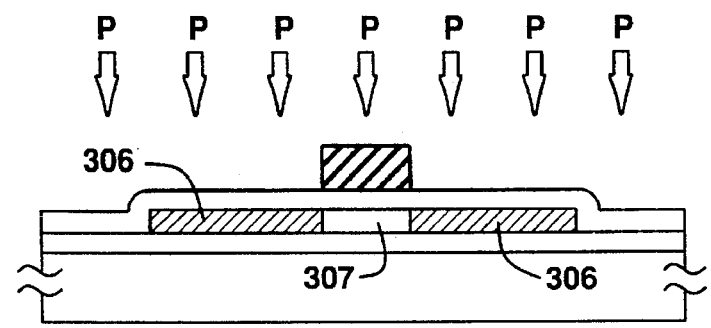
Figure 3D:
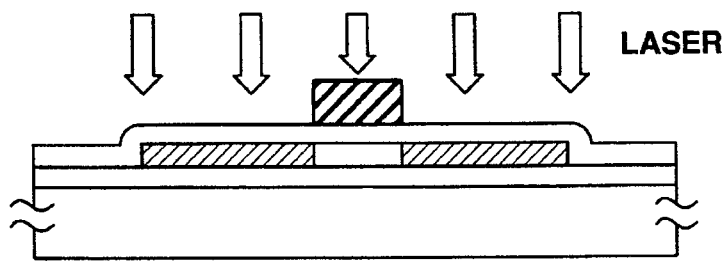
Figure 3E:
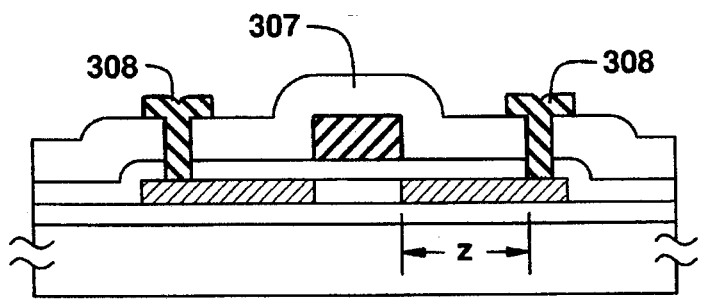

The portions of the impurity semiconductor layer may be changed to a silicide only in the upper region of the semiconductor layer as shown in FIG. 2(D) and FIG. 2(E) or it may be changed to a silicide completely through its thickness as shown in FIG. 2(F). In any event, the resistance between the channel-forming region and the source/drain region is satisfactorily small.

The effect of the present invention is, as described with reference to the above embodiments, to shorten the distance between the channel-forming region and the source/drain regions substantially, thereby lowering the resistance between them in order to improve the performance of the TFT. However, the effect of the present invention is not restricted thereto. That is, as the above resistance can be lowered considerably, the amount of the impurity to be doped into the source/drain regions may be reduced accordingly. For example, the usually required dose of $1\times10^{15}$–$8\times10^{15}$ cm$^{-2}$ may be reduced by one order or more to $5\times10^{13}$–$1\times10^{15}$ cm$^{-2}$ according to the present invention. Even with this small dose, the performance is improved over the prior art. For this reason alone, the doping time may be shortened to one tenth the time required in the prior art.

Doping at such a low concentration serves to lessen the damage in the boundaries of the channel-forming region and the source/drain regions. According to the prior art, particularly in cases where the impurity is activated by means such as laser annealing, the gate electrode and other sections tend to be obstacles to satisfactory activation of the boundaries of the channel-forming region and the source/drain regions, resulting in an increased doping dose which causes deterioration of the performance.

Moreover, the active layer may be made thinner according to the present invention. More specifically, with the large sheet resistance characteristic of the conventional processes, it is difficult to lower the thickness of the active layer to 1000 Å or less, especially to 50 Å to 500 Å. According to the present invention, no such constraints exist. In other words, with the silicide layer whose specific resistance is as low as $10^{-3}$–$10^{-5}$ Ωcm, the sheet resistance is 10Ω–1 kΩ even if the thickness reaches 100 Å.

The significance of the small thickness of the active layer implies that the time required for the formation of the active layer may be shortened, and further that the leakage current and the breaking of wire (open-circuit) due to the poor step coverage of the gate insulating film and the gate electrode may be suppressed. This is to say, it contributes to an increase in the yield.

EXAMPLE 1

Referring to FIG. 1(A), a 100–300 nm thick silicon oxide film is formed on a substrate (Corning 7059, 300 mm×400 mm or 100 mm×100 mm ) 101 as an underlying oxide film 102. Sputtering in an oxygen atmosphere is used as the process for the formation of the oxide film. For facilitating mass production, however, a plasma CVD using TEOS may be used to form a film following which the film is annealed at 450°–650° C.

Then, an amorphous silicon film is deposited to 30–500 nm, preferably to 50–100 nm by plasma CVD or LPCVD, and is allowed to stand in a reducing atmosphere at 550°–600° C. for 24 hours for crystallization. This process may be conducted by laser irradiation. Thus the crystallized silicon film is patterned into an island form. Further a 70–150 nm thick silicon oxide film 105 is formed by sputtering on this region.

Thereafter, a 100 nm–3μm thick aluminum film [containing 1 wt% Si or 01–0.3 wt% Sc (scandium)] formed by electron beam evaporation, and is then patterned to a gate electrode 106 which is in turn electrified in an electrolytic solution for anodization to form a 50–250 nm thick anodic oxide 107. The anodization process is disclosed in Japanese patent publication No. 5-267667.

Then, ion doping is used to introduce an impurity into the silicon film of respective TFTs using the gate electrode part (that is, the gate electrode and the surrounding anodic oxide film) as the mask in a self-aligning manner, and thus source/drain regions (impurity region) 103 is formed. For the formation of an NMOS type TFT, phosphor may be injected using phosphine ($PH_3$) as a doping gas, while boron may be injected using diborane ($B_2H_6$) in order to form a PMOS type TFT. The dose is $2–8 \times 10^{14}$ cm$^{-2}$, and the acceleration energy is 10–90 keV.

Then, plasma CVD is used to arrange a 400 nm–1.5μm, e.g., 900 nm, thick silicon oxide film 108 [FIG. 1(B)].

Then, dry etching according to a known RIE is conducted for the etching of the silicon oxide film 108. Here, the thickness in the direction of the height of the film on the side of the gate electrode 106 having a height of 900 nm becomes about twice the film thickness (=900 nm thickness of the silicon oxide film). The gate insulating film or silicon oxide film 105 is etched in succession to expose the source/drain region 103. By the foregoing processes, a roughly triangular insulator 109 is left on the side of the gate electrode. [FIG. 1(C)].

Thereafter, as shown in FIG. 1(D), a 5–50 nm tungsten film 110 is formed by sputtering. A KrF excimer laser (wavelength: 248 nm, pulse duration: 20 nsec) is irradiated for the reaction between the tungsten and the silicon to form a tungsten silicide region 111 on the impurity region (source/drain). The energy density of the laser light is 200–400 mJ/cm$^2$, and preferably 250–300 mJ/cm$^2$. Most of the laser light is absorbed by the tungsten film, and thus little of the light is utilized for the curing of the crystallinity of the silicon in the impurity region under the film (which had been damaged considerably by the ion doping). Tungsten silicide, however, has a low resistance of 30–100μΩcm, and thus the actual sheet resistance of the source/drain region (the region 108 and the underlying impurity region) is 10Ω/square or less. Of course, laser irradiation, heat annealing or the like may be conducted immediately after the impurity introduction process, in order to restore the deteriorated crystallinity due to the introduction of the impurity.

Thereafter, as shown in FIG. 1(E), the unreacted tungsten film is etched off to leave the tungsten silicide alone. Here, the etching may be reactive etching in an atmosphere of carbon fluoride which evaporates and removes the tungsten as tungsten hexafluoride.

Finally, a silicon oxide film is formed as an inter-layer insulator 112 by CVD on the entire surface to a thickness of 300 nm. A contact hole is formed in the source/drain of the TFT, and an aluminum wiring/electrode 113 is formed. Thus, the TFT is completed. For further activation of the impurity region, hydrogen annealing may be conducted at 200°–400° C.

EXAMPLE 2

Referring to FIG. 2(A), in the same manner as in Example 1, an underlying oxide film 202, a silicon semiconductor layer in the form of an island and a silicon oxide film which functions as a gate oxide film are formed on a substrate (Corning 7059) 201, and a gate electrode 206 is formed with an aluminum film (thickness: 200 nm–5μm). Thereafter, in the same manner as in Example 1, an anodic oxide 207 is formed around the gate electrode (the side and the top surface) by anodization. Then, ion doping is carried out to introduce an impurity using the gate electrode as the mask to form an impurity region 203. The dose is $1–5 \times 10^{14}$ cm$^{-2}$.

Then, a KrF excimer laser (wavelength: 248 nm, pulse duration: 20 nsec) is used to irradiate the structure for the activation of the doped impurity. The energy density of the laser light is 200–400 mJ/cm$^2$, and preferably 250°–300 mJ/cm$^2$ [FIG. 2(A)].

The above activation may be accomplished by lamp annealing by irradiation of IR rays. Instead, it may be conducted by any publicly known heating method. However, annealing with IR rays (e.g., 1.2μm IR rays) is extremely useful in that IR rays are selectively absorbed into the silicon semiconductor without excessively heating the glass substrate, and further the heating of the glass substrate may be suppressed by shortening each irradiation time. Then, the oxidized film gate is etched by dry etching with the above anodic oxide 207 as the mask. For example, if $CF_4$ is used as the etching gas, then the anodic oxide cannot be etched, and only the gate insulating film 205 which is silicon oxide is etched off. Thereafter, a 400 nm 1.5μm silicon oxide film 208 is formed by plasma CVD.

After that, in the same manner as in Example 1, a roughly triangular insulator 209 of silicon oxide is formed on the side of the gate electrode by anisotropic etching. Then, as shown in FIG. 2(C), a 5–50 nm titanium film 210 is formed by sputtering, after which the film is heated to 250°–450° C. for the reaction between the titanium and the silicon to form a titanium silicide region 211 on the impurity region (source/ drain). Here, the heating is desired to be conducted at a temperature at which a hillock is not formed on the gate electrode and the like.

The above annealing may be carried out with lamp annealing with IR rays. If lamp annealing is used, then the lamp irradiation should be conducted for several minutes at 600° C. or for several seconds at 1,000° C. so that the irradiated surface attains around 600°–1,000° C. In this case where aluminum is used as the gate electrode, the heat annealing after the formation of the titanium film should be conducted at the temperature up to 450° C., though it is preferably conducted at the temperature of 500° C. or more if the gate electrode mainly comprises silicon.

Thereafter, the Ti film is etched with an etching solution comprising a 5:2:2 mixture of hydrogen peroxide, ammonia and water. Here, the silicide layer 211 is kept intact without being etched off. Finally, as shown in FIG. 2(E), over the entire surface, a 300 nm thick silicon oxide film is formed as the layer insulator 212 by CVD, after which a contact hole is formed in the source/drain of the TFT, and an aluminum wiring/electrode 213 is formed. By the foregoing procedures, the TFT is completed.

EXAMPLE 3

Figure 4A:
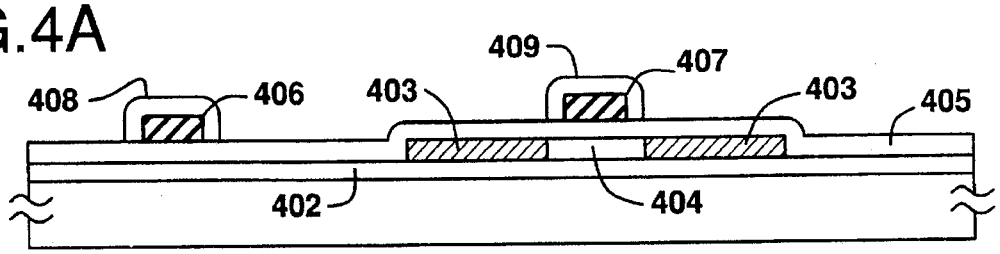
FIGS. 4(A) to 4(E) illustrate a process for the preparation of an active matrix substrate according to Example 3.

The present example relates to a process for the preparation of a substrate for an active matrix type liquid display device. Initially, as shown in FIG. 4(A), in the same manner as in Example 1, an underlying oxide film 402, a silicon semiconductor film and a silicon oxide film 405 which functions as a gate oxide film are formed on a substrate (Corning 7059) 401, and a gate electrode 407 is formed with an aluminum film (thickness: 200 nm–5µm), followed by the formation of wiring (first layer wiring) 406 in the same layer. Thereafter, in the same manner as in Example 1, anodic oxides 408, 409 are formed around the gate electrode (the side and the top surface) by anodization. Then, ion doping is performed to introduce an impurity to form an impurity region 403. Then, a KrF excimer laser (wavelength: 248 nm, pulse duration: 20 nsec) is used to irradiate the structure for the activation of the doped impurity. The energy density of the laser light is 200–400 mJ/cm$^2$, preferably 250–300 mJ/cm$^2$.

Figure 4B:
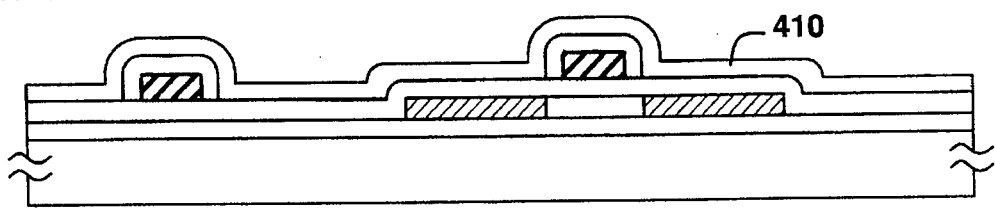

Then, as shown in FIG. 4(B), a silicon oxide film 410 is deposited. Further, anisotropic etching is conducted in the same manner as in Example 1 to form roughly triangular insulators 411 and 412 on the sides of the gate electrode and the first layer wiring. Thereafter, the source/drain region is exposed, after which a 5–50 nm titanium film is formed by sputtering. Since the substrate temperature at the time of film formation is adjusted to 200°–450° C., preferably 200°–300° C., the titanium and the silicon in the film reacts with each other, and thus a silicide layer 413 is formed on the surface of the source/drain region.

Figure 4C:
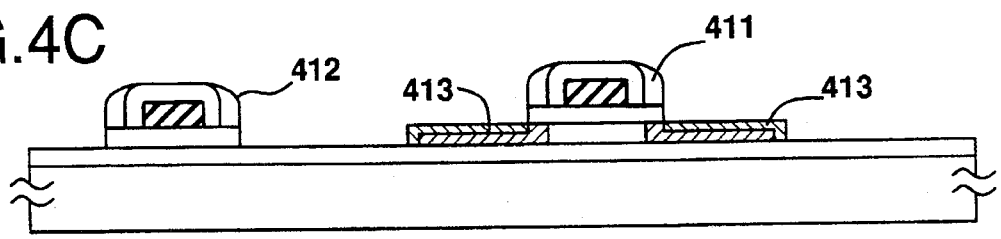
Figure 4D:
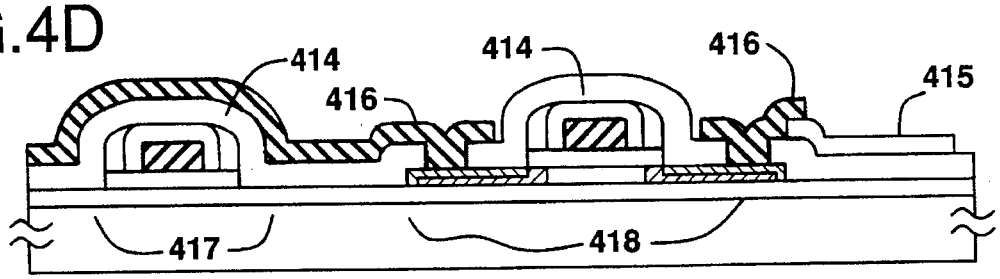

Then, as shown in FIG. 4(C), the remaining titanium film is etched off. Further, a 600 nm thick silicon oxide film is formed by CVD as an inter-layer insulator 414 over the entire surface. In addition, a 50–100 nm ITO film is formed by sputtering, and then patterned to form a pixel electrode 415. Finally, as shown in FIG. 4(D), a contact hole is formed in the source/drain of the TFT, and a multilayer film of titanium nitride and aluminum is formed and patterned to form a second layer wiring/electrode 416. The thicknesses of the titanium oxide and aluminum are 80 nm and 500 nm, respectively. By the foregoing procedures, an active matrix substrate is completed.

Figure 4E:
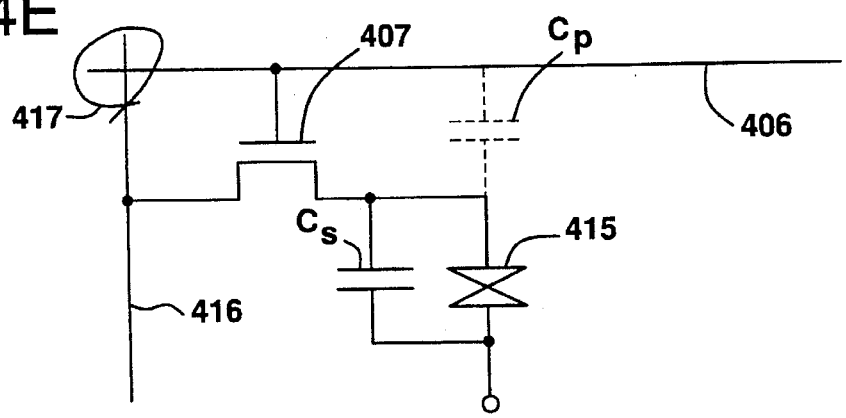

Of the active matrix prepared according to the present example, a circuit for one pixel is shown in FIG. 4(E). In the present example, the sheet resistance of the source/drain does not cause a problem even if the source/drain region electrode 416 and the gate electrode 407 are kept apart from each other considerably, and since the gate electrode is an offset gate, the parasitic capacity Cp between the gate electrode and the source/drain region (or the source/drain electrode) is satisfactory small to enable an ideal active matrix. Therefore, the sustained capacity Cs prepared in parallel with the pixel capacity may be considerably small or unnecessary. Thus, the aperture ratio of the pixel is increased.

In FIGS. 4(D) and 4(E), reference numeral 417 indicates a region where the first aluminum wiring 406 and the second wiring 416 intersects each other. In this region, the insulating layer 412 makes the step around the wiring 406 moderate and lessens the possibility of a breakage of the second wiring 417.

The peripheral circuit for driving the active matrix may be prepared with TFTs according to the present invention, wherein the anodic oxide 409 may be thinner than that in the present example (pixel TFT), or may be omitted. This is because TFTs for peripheral circuits require the influence of parasitic capacity Cp less than the pixel TFT.

EXAMPLE 4

Figure 5:
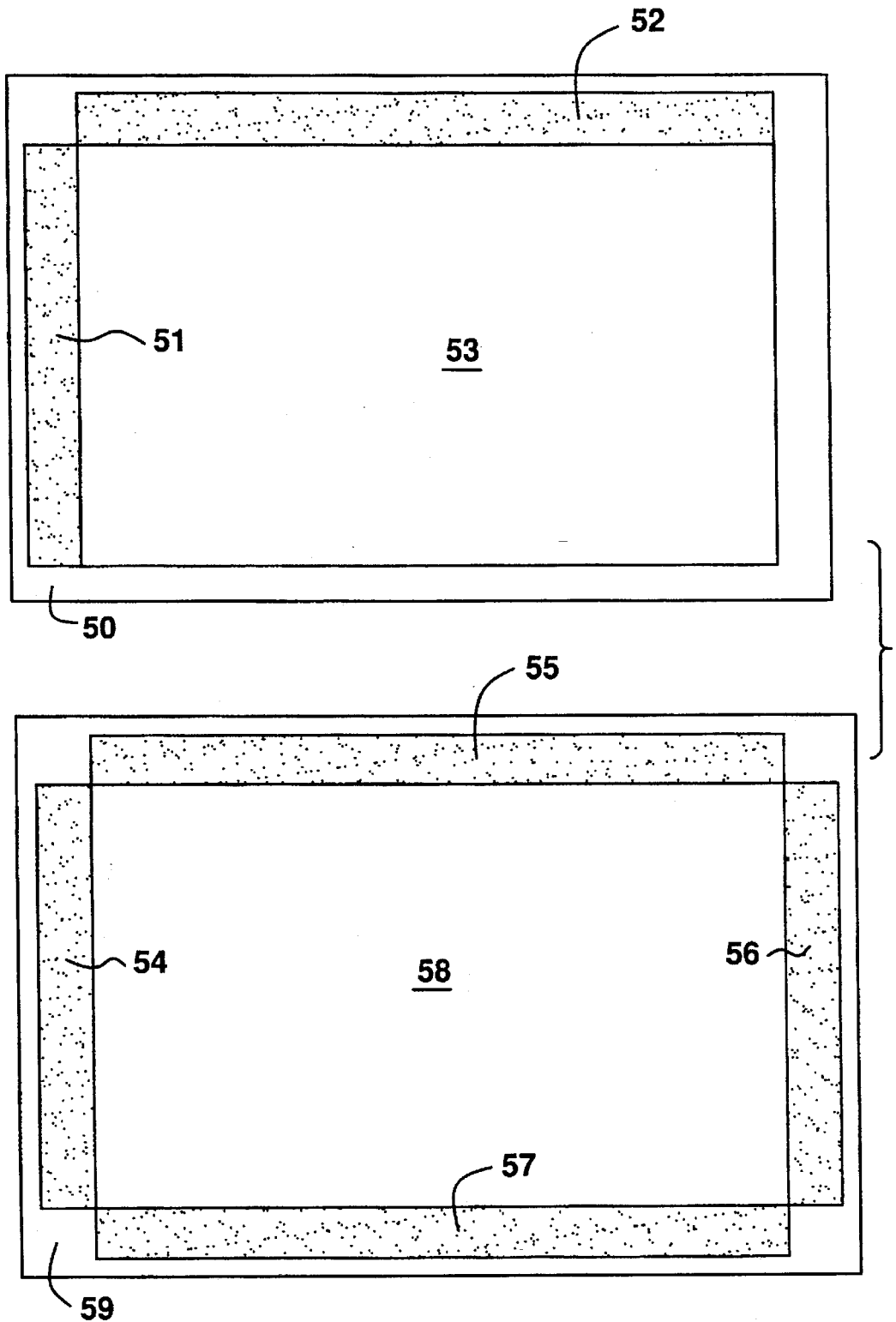
FIG. 5 is an illustrative layout of a monolithic active matrix circuit.

FIG. 5 is a schematic diagram of a monolithic circuit for an electro-optical device, for example, wherein an active matrix region such as a pixel region and a peripheral circuit region for driving it are formed on the same substrate. The two examples are shown in FIG. 5. Here, reference numerals 53 and 58 indicate active matrix regions, while 51, 52 and 54–57 are peripheral circuit regions. In addition, 50 and 59 are substrates.

Care to be taken for the construction of such a monolithic circuit is that the characteristic of the TFT required for the active matrix region is different from that for the peripheral circuit region. That is, one with a reduced leakage current (OFF-state current) is required for the former case where the charge accumulated in the pixel electrode, etc. must be held. On the contrary, the latter case requires a TFT with excellent high speed performance characteristics namely TFT with an increased ON-state current. However, since the two characteristics are contradictory to each other, the preparation of a TFT satisfying the two characteristics is difficult.

In order to solve such a problem, it is desired to use separate TFTs for the peripheral circuit region and the active matrix region in view of the respective characteristics required. Hereunder, the manufacturing process of the present example will be explained in brief.

Referring to FIGS. 6(A)–6(E), crystalline silicon layers 603 and 604 are formed on a substrate 601 having an underlying film 602 thereon. Here, the region 603 is the silicon region used for the TFT of the peripheral circuit region, whereas the region 604 is the silicon region used for the TFT of the active matrix circuit region. Preferably, the region 604 contains either one of oxygen, carbon, and nitrogen at $5 \times 10^{19}$–$5 \times 10^{21}$ atoms/cm$^3$. As a result, the leakage current of the TFT of the active matrix region may be further reduced. Ion injection or another means may be used for such introduction of oxygen, nitrogen or carbon.

Figure 6A:
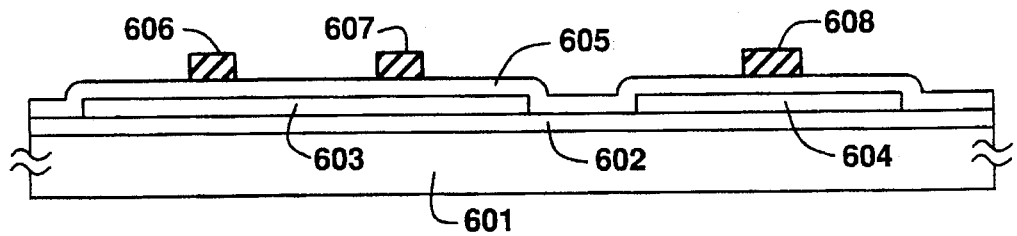
FIGS. 6(A) to 6(E) illustrate a process for the preparation of an active matrix substrate according to Example 4.
Figure 6B:
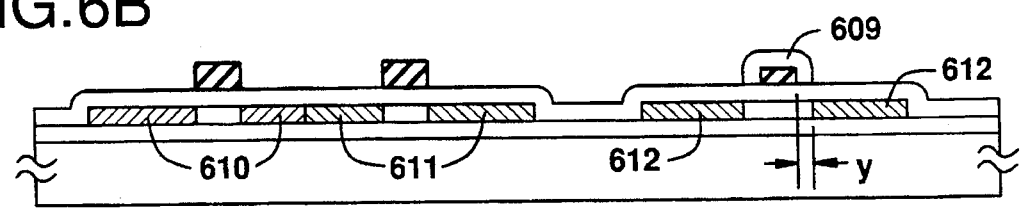

After the formation of the crystalline silicon region, a gate oxide film 605 is formed, then gate electrodes 606–608 are formed using an anodizable metallic material (e.g., aluminum) [FIG. 6(A)].

Then, only the gate electrode 608 is electrified in an electrolytic solution to form an anodic oxide layer 609 on the side and the top surface of the gate electrode 608. Then, an impurity is introduced by means such as ion doping to form a p type region 610 and n type regions 611 and 612, after which the impurity is activated by irradiation of laser light. As the result, in the TFT of the active matrix region, the gate electrode is offset from the source/drain by the distance indicated by y. Y is set to, for example, 1500–3500 Å [FIG. 6 (B)].

Figure 6C:
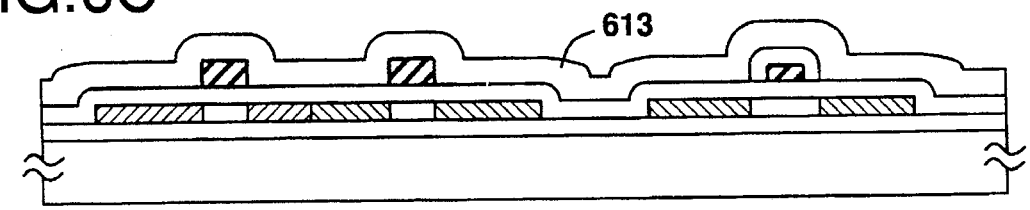
Figure 6D:
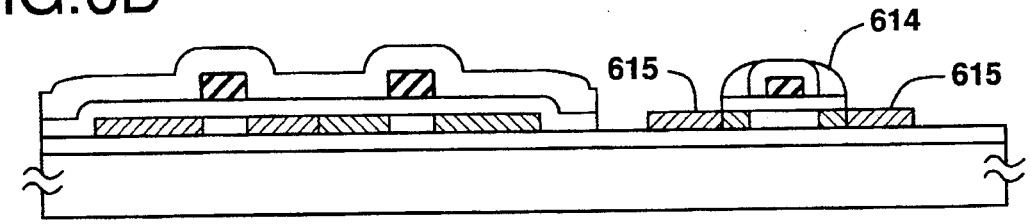

Then, over the entire surface is formed a silicon oxide insulating layer 613 [FIG. 6(C)].

Further, the active matrix region is exposed while masking the peripheral circuit region, after which, as shown in FIG. 1(C) of Example 1, a spacer 614 is formed on the side of the gate electrode of the TFT by anisotropic etching. Then, a titanium film is formed, and reacted with the silicon film of the TFT of the exposed active matrix region to form a silicide layer 615 [FIG. 6(D)].

Thereafter, an inter-layer insulator 616 is formed on the entire surface, followed by formation of an ITO film which is then patterned to form a pixel electrode 617. In addition, a contact hole is formed in the layer insulator 616 to form metallic electrodes 618–622. By following the above-mentioned procedures, a monolithic active matrix circuit is formed [FIG. 6 (E)].

EXAMPLE 5

This example relates to a monolithic circuit wherein an active matrix region and a peripheral circuit region for its driving are formed on the same substrate, as described in Example 4.

Figure 7A:
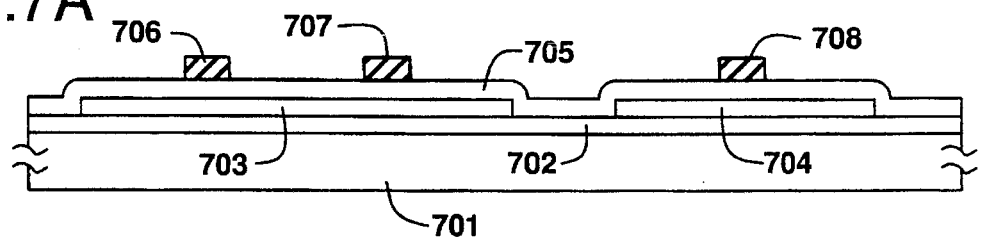
FIGS. 7(A) to 7(E) illustrate a process for the preparation of an active matrix substrate according to Example 5.

Referring to FIG. 7(A), crystalline silicon regions 703 and 704 are formed on a substrate 701 having an underlying film 702 thereon. Here, the region 703 is the silicon region used for the TFT of the peripheral circuit region, whereas the region 704 is the silicon region used for the TFT of the active matrix circuit region.

After the formation of the crystalline silicon region, a gate oxide film 705 is formed, and then gate electrodes 706–708 are formed using an anodizable metallic material (e.g., aluminum) [FIG. 7(A)].

Then, the gate electrodes 706–708 are electrified in an electrolytic solution to form anodic oxide layers 709–711 on the side and the top surface of the gate electrodes. Here, the electrification time for the gate electrodes 706 and 707 is shortened compared with that for the gate electrode 708. As a result, the thickness of the anodic oxide layers 709 and 710 is made smaller than that of the anodic oxide layer 711, and accordingly the offset distance y' of the TFT of the peripheral circuit region is shorter than the offset distance y of the active matrix region. The y is set to, for example, 2000–3500 Å, while y' to 500–1500 Å.

Thus, anodization of both the gate electrode of the TFT of the active matrix region and the gate electrode of the TFT of the peripheral circuit region serves to prevent the gate electrode/wiring from being destroyed due to the later thermal treatment and laser irradiation. Particularly, while a hillock is formed at a high temperature of more than 300° C. when the material for the gate electrode/wiring mainly comprises aluminum, the formation of hillocks is prevented by the formation of an anodic oxide film having such a thickness.

Figure 7B:
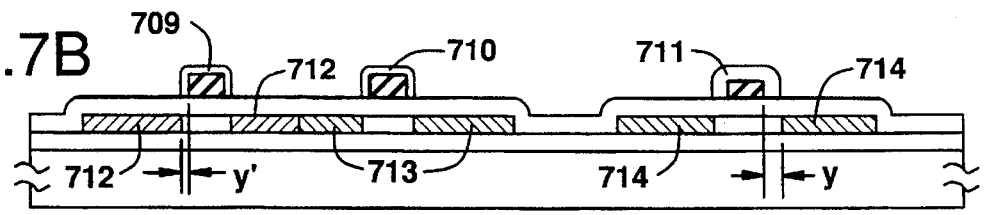

Thereafter, an ion doping method or the like is used to introduce an impurity to form a p type region 712, and n type regions 713 and 714. In addition, laser light is irradiated to activate the impurities [FIG. 7(B)].

Figure 7C:
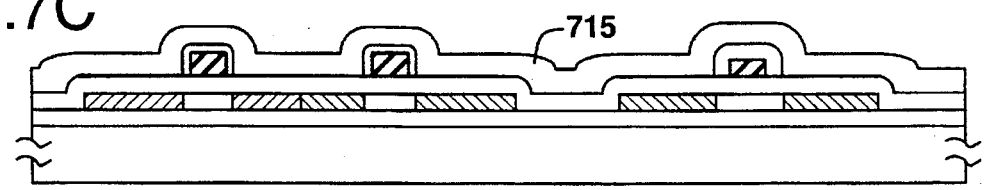

Then, over the entire surface is formed a silicon oxide insulating layer 715 [FIG. 7(C)].

Figure 7D:
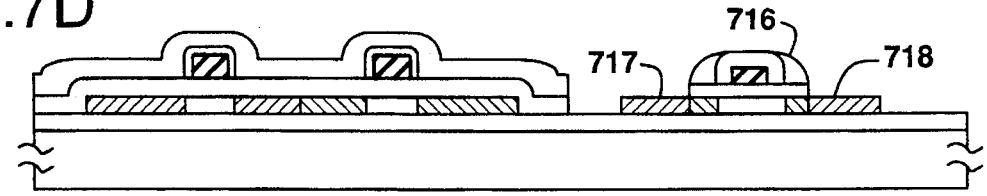

Further, the active matrix region is exposed while masking the peripheral circuit region, after which, as shown in FIG. 1(C) relating to Example 1, a roughly triangular insulator 716 is formed on the side of the gate electrode of the TFT by anisotropic etching. Then, a titanium film is formed, and is then reacted with the silicon film of the TFT of the exposed active matrix region to form a silicide layer 718 [FIG. 7(D)].

Figure 7E:
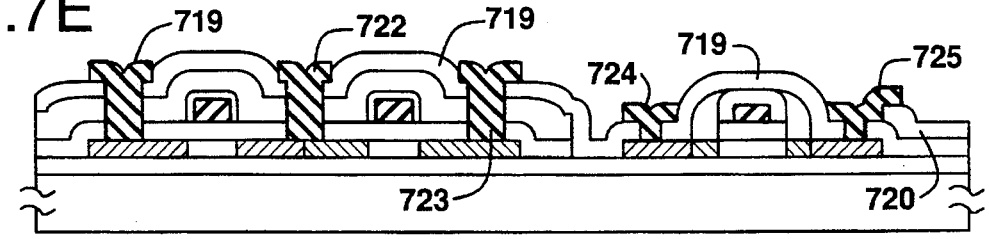

Thereafter, an inter-layer insulator 719 is formed on the entire surface, followed by the formation of an ITO film which is then patterned to form a pixel electrode 720. In addition, a contact hole is formed in the layer insulator 719 to form metallic electrodes 721–725. By the above-mentioned procedures, a monolithic active matrix circuit is completed [FIG. 7(E)].

EXAMPLE 6

This example relates to a monolithic circuit wherein an active matrix region and a peripheral circuit region for driving it are formed on the same substrate, as in Example 4.

Figure 8A:
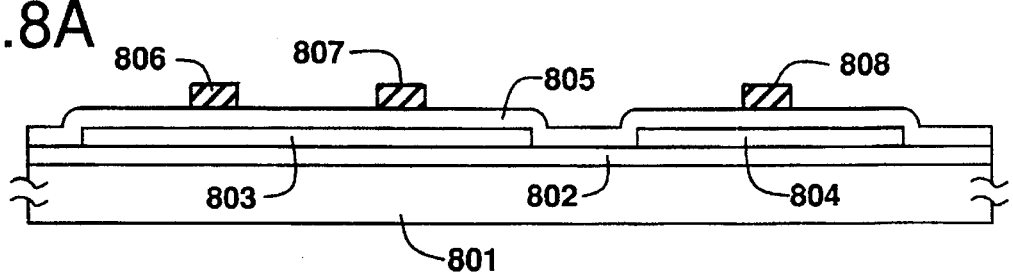
FIGS. 8(A) to 8(E) illustrate a process for the preparation of an active matrix substrate according to Example 6.

Referring to FIG. 8(A), crystalline silicon regions 803 and 804 are formed on a substrate 801 and an underlying film 802 thereon. Here, the region 803 is the silicon region used for the TFT of the peripheral circuit region, whereas the region 804 is the silicon region used for the TFT of the active matrix circuit region. After the formation of the crystalline silicon region, a gate oxide film 805 is formed, then gate electrodes 806–808 are formed using an anodizable metallic material (e.g., tantalum).

Figure 8B:
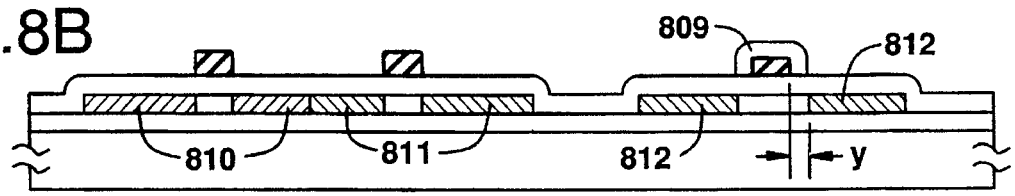

Then, only the gate electrode 808 in the active matrix portion is electrified in an electrolytic solution to form an anodic oxide layer 809 on the side and the top surface of the gate electrode. Thereafter, an impurity is introduced to the semiconductor films to form a p type region 810, and n type regions 811 and 812 by an ion doping method or the like. Thereafter, the impurity is activated by using laser light. [FIG. 8(B)].

Figure 8C:
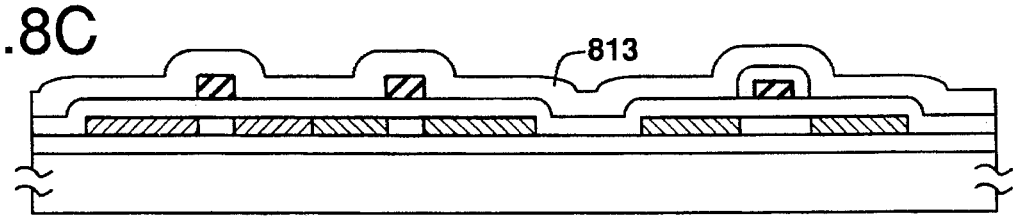

Then, over the entire surface is formed a silicon oxide insulating layer 813 [FIG. 8(C)].

Figure 8D:
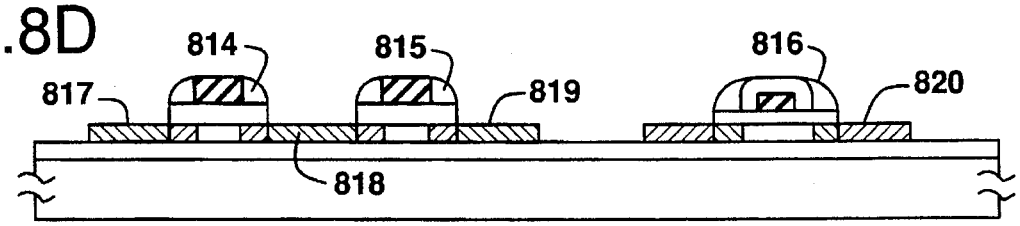

Further, in the same manner as in Example 1, insulating spacers 814–816 are formed on the side of the gate electrode of the TFT by anisotropic etching. Portions of the active layers are also exposed by this etching. Then, a titanium film is deposited on the whole surface of the structure. The titanium film reacts with the exposed portion of the silicon films, as a result, titanium silicide layers 817–820 are formed as shown in FIG. 8(D).

Figure 8E:
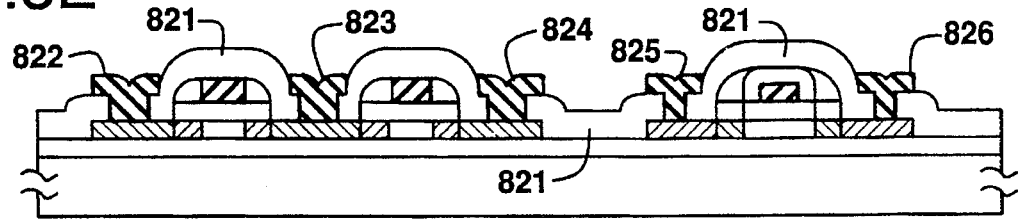

Thereafter, an inter-layer insulator 820 is formed on the entire surface and contact holes are formed therethrough to form a metallic electrodes 822–826. By the above-mentioned procedures, a monolithic active matrix circuit is prepared as shown in FIG. 8(E).

Figure 10A:
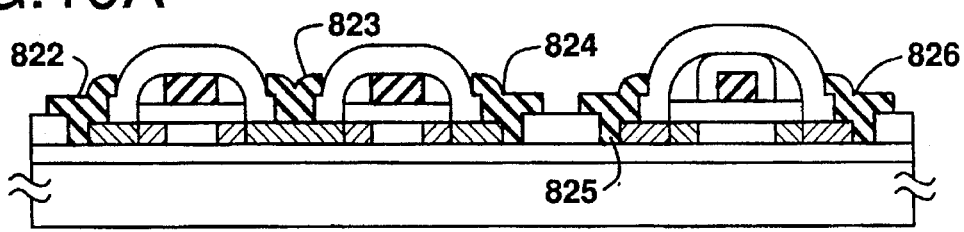
FIG. 10(A) shows a cross section of a modification of a monolithic circuit shown in FIG. 8(E)
Figure 11A:
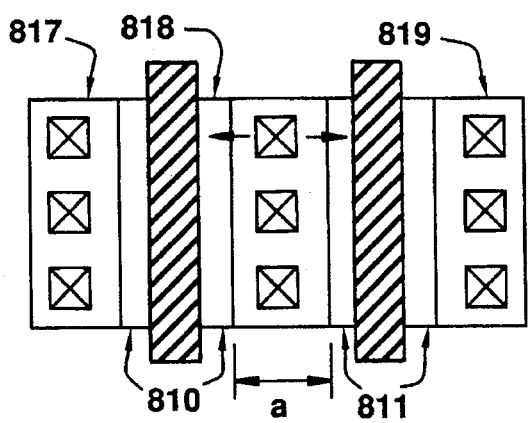
FIG. 11(A) shows a top plane view of FIG. 8(E)
Figure 11B:
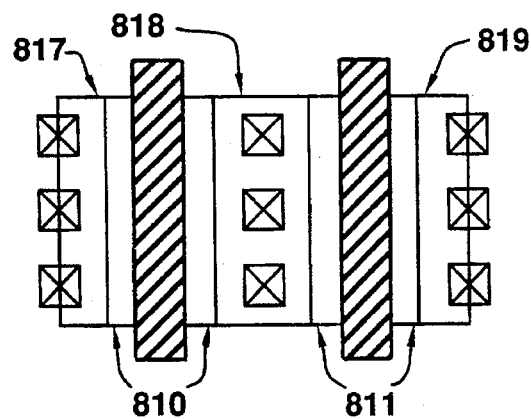
FIG. 11(B) shows a top plane view of FIG. 10(A)

As shown in FIG. 10(A), the contact holes may be formed through the inter-layer insulator in such a manner that the edges of the semiconductor islands locate within the contact holes, in other words, the electrodes 822, 824, 825 and 826 extends beyond the edges of the corresponding source or drain regions. FIG. 11(A) is a top plane view corresponding to the structure shown in FIG. 8(E) while FIG. 11(B) is a top plane view corresponding to the structure shown in FIG. 10(A). As is clearly seen in these drawings, the area occupied by the active layers can be reduced in the case of the structure shown in FIG. 11(B), i.e. FIG. 10(A). Accordingly, the structure of FIG. 10(A) is advantageous in that a design of the circuit can be eased. In particular, it will contribute to the increase in an aperture ratio in an active matrix circuit.

When forming contact holes in the above manner in which the contact holes extend on the area other than the active region, it is desirable if the material of the underlying film has a smaller etching rate than the material of the inter-layer insulator in order to prevent the substrate surface from being overetched. For example, if silicon oxide is used as the inter-layer insulator, the underlying layer has to comprise alumina or aluminum nitride. Alternatively, the underlying layer may be a multi-layer of a silicon oxide layer and one of alumina or aluminum nitride layer. Thereby, even if the silicon oxide layer is overetched, the underling layer stops the overetching.

Figure 6E:
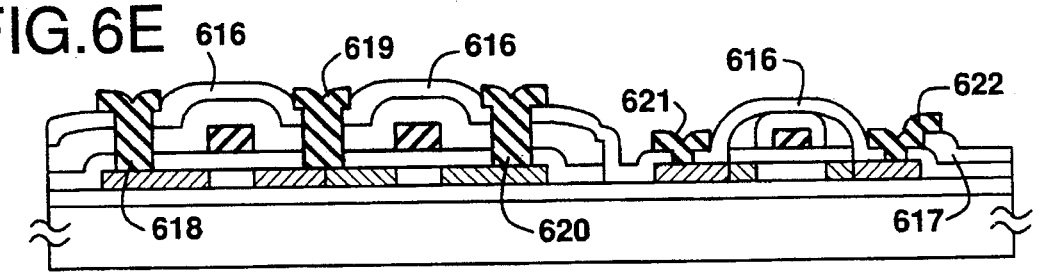

In this example, the PTFT and the NTFT are formed in the same semiconductor layer 803 as is the same in Example 4 (FIG. 6(E)). However, while the electrode 619 is directly formed on the impurity regions of the both PTFT and NTFT in FIG. 6(E), the electrode 823 is connected to the impurity regions of the PTFT and NTFT through the silicide layer. This structure is particularly advantageous for the following reason.

Figure 11C:
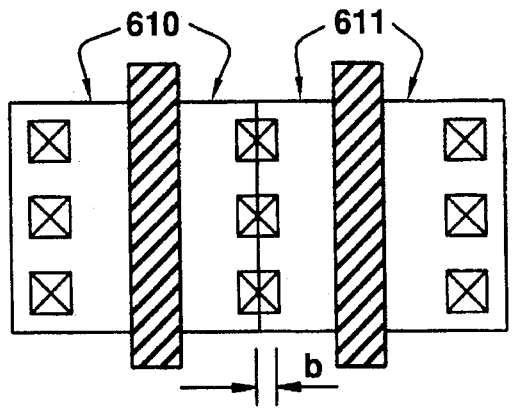
FIG. 11(C) shows a top plane view of FIG. 6(E)

In the case of the structure of FIG. 6(E), it is necessary to provide the electrode 619 on both the n-type region 611 and the p-type region 610. If the contact hole is mislocated and the electrode 619 is formed on the impurity region of only one of the PTFT and NTFT, the other one of the TFTs can not be electrically connected. For this reason, it is necessary to locate the center of the contact hole within the region "b" as shown in FIG. 11(C). Accordingly, the size of the contact hole necessarily increases. However, as the density of the circuit increases, the production yield unavoidably decreases due to an error in mask-alignment.

On the other hand, because of the existence of the silicide layer in the present example, the contact hole can be located anywhere within the region "a" shown in FIG. 11 (A). Accordingly, this will lead to the increase in production yield and the density of the circuit.

EXAMPLE 7

This example relates to a monolithic circuit wherein an active matrix region and a peripheral circuit region for driving it are formed on the same substrate, as in Example 4.

Figure 9A:
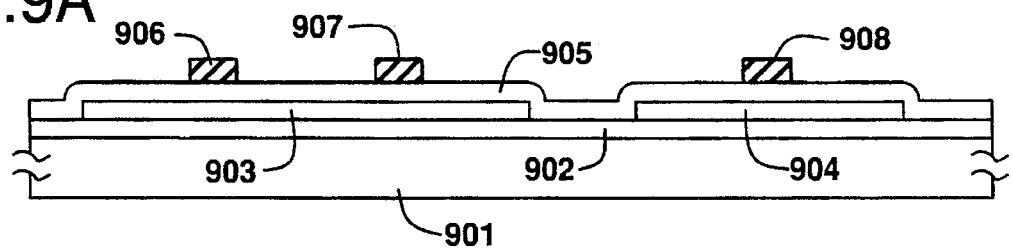
FIGS. 9(A) to 9(E) illustrate a process for the preparation of an active matrix substrate according to Example 7.

Referring to FIG. 9(A), crystalline silicon regions 903 and 904 are formed on a substrate 901 and an underlying film 902 thereon. Here, the region 903 is the silicon region used for the TFT of the peripheral circuit region, whereas the region 904 is the silicon region used for the TFT of the active matrix circuit region. After the formation of the crystalline silicon region, a gate oxide film 905 is formed, then gate electrodes 906–908 are formed using an anodizable metallic material (e.g., tantalum). Then, the gate electrodes 906–908 are electrified in an electrolytic solution to form anodic oxide layers 909–911 on the side and the top surface of the gate electrodes. Here, the electrification time for the gate electrodes 906 and 907 is shortened compared with that for the gate electrode 908. As a result, the thickness of the anodic oxide layers 909 and 910 are smaller than that of the anodic oxide layer 911, and accordingly the offset distance of the TFT of the peripheral circuit region is shorter than the offset distance of the active matrix region.

Figure 9B:
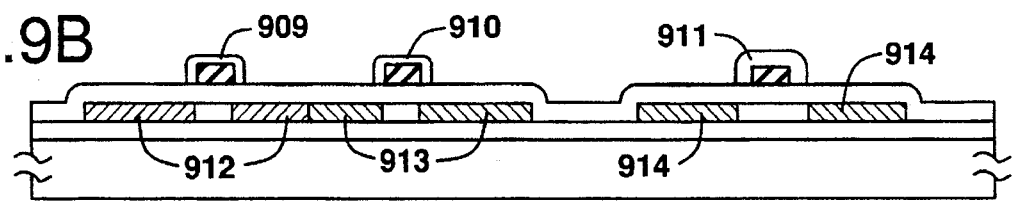

Thereafter, a p type region 912, and n type regions 913 and 914 are formed by introducing an impurity therein by an ion doping method or the like. Thereafter, laser light is irradiated to activate the impurity [FIG. 9(B)].

Figure 9C:
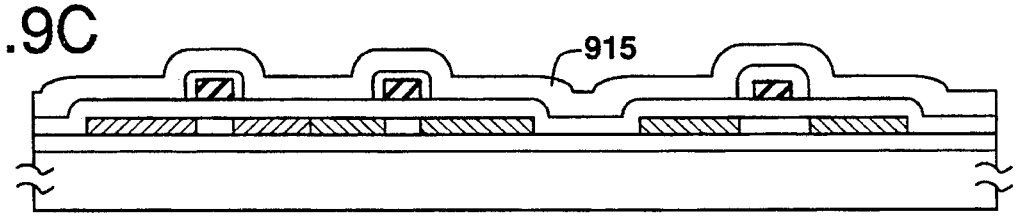

Then, over the entire surface is formed a silicon oxide insulator layer 915 [FIG. 9(C)].

Figure 9D:
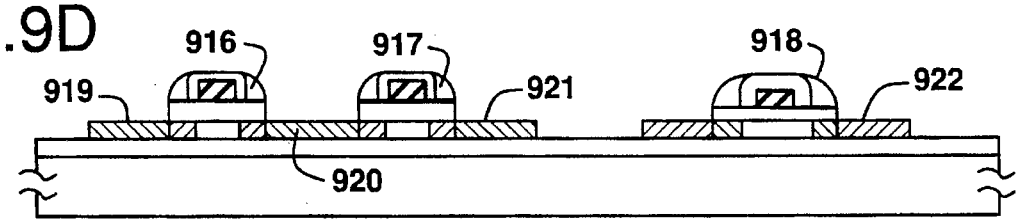

Further, as shown in Example 1 of FIG. 1(C), insulating spacers 916–918 are formed on the side of the gate electrodes of the TFT by anisotropic etching. In this state, titanium films are formed, and are then reacted with the exposed silicon films of the TFT to form silicide layers 919–922 [FIG. 9(D)].

Figure 9E:
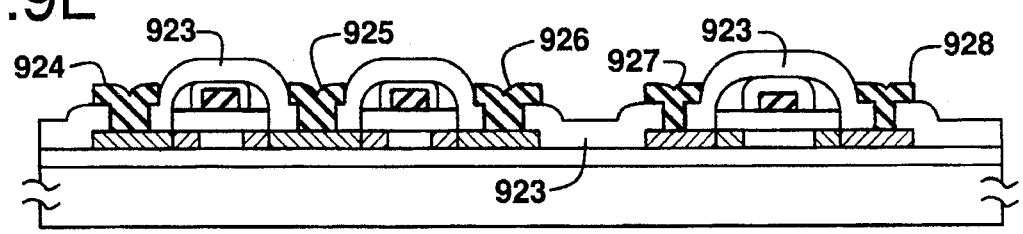

Thereafter, an inter-layer insulator 923 is formed on the entire surface, after which contact holes are formed in the layer insulator 923 to form metallic electrodes 924–928. By the above mentioned procedures, a monolithic active matrix circuit is completed [FIG. 9(E)].

Figure 10B:
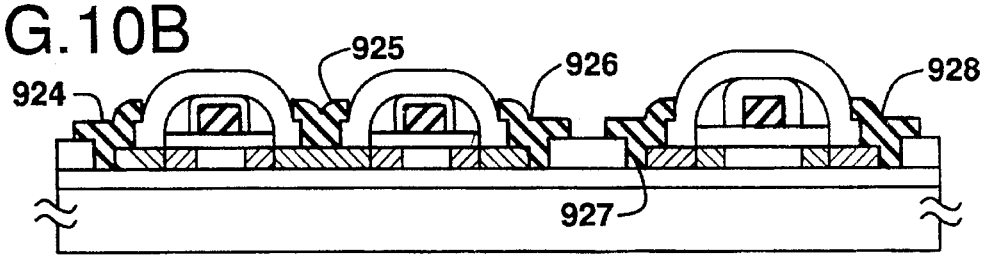
FIG. 10(B) shows a cross section of a modification of a monolithic circuit shown in FIG. 9(E)

In the present example, the contact holes may be formed in such a manner that the metal electrodes extend beyond the source/drain regions as shown in FIG. 10(B).

EXAMPLE 8

FIG. 12(A) to 12(F) are cross-sectional views showing a manufacturing process of a monolithic circuit, which includes an active-matrix region and a peripheral circuit region for driving the active matrix region formed on a same substrate like in Example 4.

Reference numeral 1 shows a substrate, 2 shows an underlying layer, 3 and 4 show crystalline silicon regions. The underlying layer 2 comprises an aluminum nitride layer having 500 Å thick and a silicon oxide layer having 1000 Å formed thereon. They are both formed by sputtering. Also, the region 3 is used for forming TFTs of a peripheral circuit while the region 4 is used for forming TFTs of an active matrix circuit.

Figure 12A:
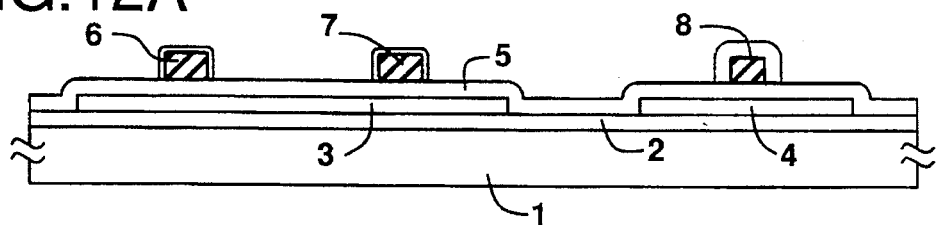
FIGS. 12(A) to 12(F) illustrate a process for the preparation of an active matrix substrate according to Example 8.
Figure 12B:
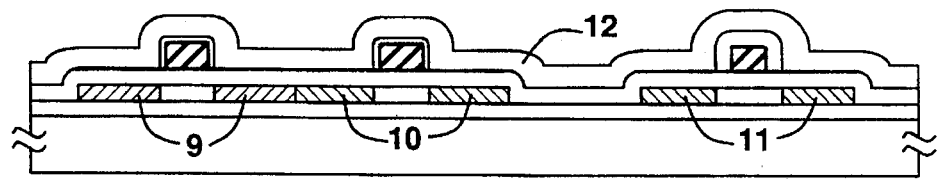

After the formation of the crystalline silicon regions, a gate oxide film 5 is formed, following which gate electrodes 6, 7 and 8 are formed of an anodizable metal material, for example, tantalum. An anodic oxide layer is formed on the top and side surfaces of the gate electrodes in such a manner that the thickness of the anodic oxide in the peripheral circuit area and that of the anodic oxide in the active-matrix area are different from one another as shown in FIG. 12(B). In this example, the anodic oxide of the gate electrodes 6 and 7 in the peripheral area is 500 Å, while that in the active matrix area is 2500 Å thick.

N-type regions 9, p-type regions 10 and 11 are formed by introducing impurities through ion doping or the like with the gate electrode and its associated anodic oxide used as a mask. Furthermore, a laser light is irradiated onto the impurity added area to activate the impurities. Thereafter, an insulator 12 comprising silicon oxide is formed on the entire structure as shown in FIG. 12(B).

Figure 12C:
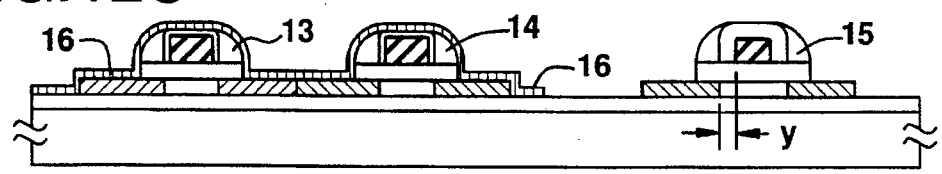

Then, in the same manner as in Example 1, the insulator 12 is etched off by anisotropic etching to form spacers 13, 14 and 15 on the side surfaces of the respective gate electrodes. A titanium film 16 is formed on this structure. The portion of the titanium film formed in the active matrix area is removed so that the film remains only on the peripheral circuit area as shown in FIG. 12(C).

Figure 12D:
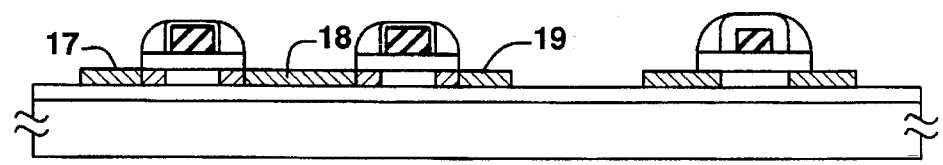

The titanium film and the silicon film contacting thereto are reacted at 350° C. to form silicide layers 17, 18 and 19. Obviously, there is no silicide formed in the active matrix area where titanium film does not exist. After the formation of the silicide layers, the remaining titanium film is removed as shown in FIG. 12(D)

Figure 12E:
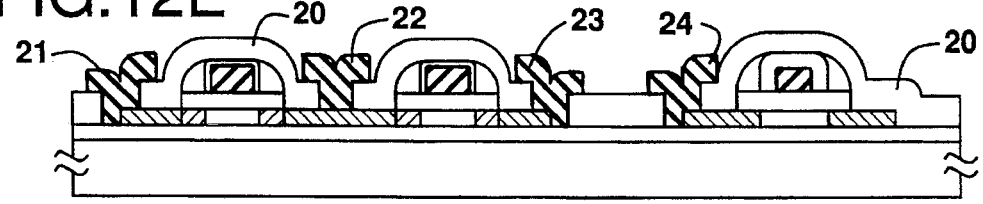
Figure 12F:
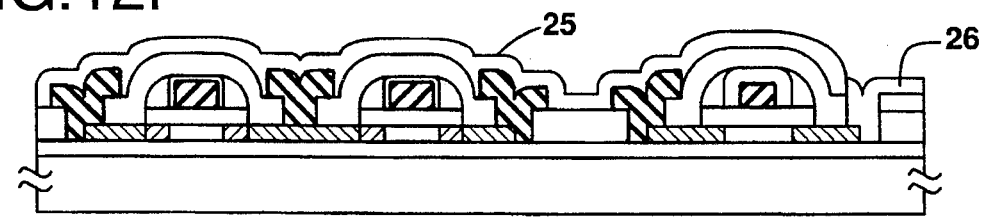

Then, referring to FIG. 12(E), a first inter-layer insulating layer 20 is formed on the whole surface of the structure. Contact holes are formed through the insulating layer 20 and metal electrodes 21, 22, 23 and 24 are formed therein. The contact holes are provided in such a manner that the metal electrodes extends beyond the edges of the corresponding source/drain regions.

Further, a second inter-layer insulator 25 is formed, following which a contact is formed through the first and second interlayer insulator and an ITO film is formed there. Thus, a pixel electrode 26 of an active matrix circuit is formed.

The monolithic circuit in the present example, the TFTs in the peripheral circuit are provided with silicide layers whereas the TFTs in the active matrix circuit area are provided with an offset gate area having 2500 Å width.

According to the present invention, the substantial resistance in the source/drain region is remarkably lowered. In the present invention, a silicide film is formed on the surface of a silicon semiconductor (source/drain) thereby lowering the sheet resistance significantly, typically to 100Ω/square or less. The formation of a metallic film is necessary to obtain the silicide film according to the present invention. The time required for the formation is negligible, and presents no obstacle to mass production.

According to the present invention, the process for the restoration of the crystallinity (activation process) after the ion injection is optional for the impurity region comprising the semiconductor lying under the silicide layer. For example, when the impurity is introduced by ion doping, about 10 kΩ/square of sheet resistance is accomplished without the activation process, by heavy doping at $10^{15}$ cm$^{-2}$ or more, and thus, in such a case where a low-resistant silicide layer is formed in close contact with the impurity region as in the present invention, the substantial sheet resistance of the source/drain is quite low.

Silicon semiconductors not subjected to the activation process, however, have many defects, and sometimes cannot be reliably used depending on the purpose. In such cases, it is necessary to carry out an activation of the impurity regions. Since the activation process for such cases is not aimed at optimizing the sheet resistance of the impurity region, it may be conducted under more moderate conditions than according to the prior art.

While several examples have been described, the scope of the present invention should not be limited to the specific structures of those examples. For example, while the invention has been described with respect to a top-gate type TFT, the invention may be applied to a bottom gate type TFT.

What is claimed is:

1. A semiconductor device comprising:

a substrate having an insulting surface; and a plurality of thin film transistors formed on said insulating surface, at least one of said thin film transistors comprising a silicon semiconductor layer including source, drain and channel regions, metal silicide regions connected to said source and drain regions, a gate insulating layer formed on said semiconductor layer, a gate electrode formed on said gate insulating layer, and an oxide insulating layer comprising an oxide of a material of said gate electrode formed on at least side surfaces of said gate electrode, wherein said at least one of the thin film transistors is provided with side spacers adjacent to the side surfaces of said gate electrode with said oxide insulating layer interposed therebetween, and inner edges of said metal silicide regions are substantially aligned with outer edges of said side spacers.

2. The semiconductor device of claim 1 wherein said metal is selected from the group consisting of molybdenum (Mo), tungsten (W), platinum (Pt), chromium (Cr), titanium (Ti), and cobalt (Co).

3. The semiconductor device of claim 1 wherein said metal silicide region has the same thickness as said source and drain regions.

4. A semiconductor device comprising:

a substrate having an insulating surface; and a plurality of thin film transistors formed on said insulating surface, at least one of said thin film transistors comprising a silicon semiconductor layer including source, drain and channel regions, metal silicide regions connected to said source and drain regions, a gate insulating layer formed on said semiconductor layer, a gate electrode formed on said gate insulating layer, and an oxide insulating layer comprising an oxide of a material of said gate electrode formed on at least side surfaces of said gate electrode wherein said source and drain regions are offset from said gate electrode by a thickness of said oxide insulating layer wherein said at least one of the thin film transistors is provided with side spacers adjacent to the side surfaces of said gate electrode with said oxide insulating layer interposed therebetween, and inner edges of said metal silicide regions are substantially aligned with outer edges of said side spacers.

5. The device of claim 4 wherein said oxide insulating layer comprises an anodic oxide of the material of said gate electrode.

6. The semiconductor device of claim 4 wherein said metal is selected from the group consisting of molybdenum (Mo), tungsten (W), platinum (Pt), chromium (Cr), titanium (Ti), and cobalt (Co).

7. The semiconductor device of claim 4 wherein said metal silicide region has the same thickness as said source and drain regions.

8. A monolithic circuit comprising:

a substrate having an insulating surface, said substrate including an active matrix circuit portion and a peripheral circuit portion;

a first plurality of thin film transistors formed on the active matrix circuit portion of the substrate, each of said first plurality of thin film transistors having at least silicon semiconductor layer including source, drain and channel regions therein, an insulated gate electrode formed on said channel region, and an oxide insulating layer comprising an oxide of a material of said gate electrode formed on at least side surfaces of said gate electrode; and a second plurality of thin film transistors formed on the peripheral circuit portion of the substrate for driving said first plurality of thin film transistors, each of said second plurality of thin film transistors having at least silicon semiconductor layer including source, drain and channel regions therein, and an insulated gate electrode adjacent to said channel region, wherein only said first plurality of thin film transistors are provided with metal silicide regions on or in contact with the source and drain regions thereof, and each of said first plurality of thin film transistors is provided with side spacers adjacent to the side surfaces of said gate electrode with said oxide insulating layer interposed therebetween, and inner edges of said metal silicide regions are substantially aligned with outer edges of said side spacers.

9. The monolithic circuit of claim 8 wherein said metal is selected from the group consisting of molybdenum (Mo), tungsten (W), platinum (Pt), chromium (Cr), titanium (Ti), and cobalt (Co).

10. The monolithic circuit of claim 8 wherein said metal silicide region has the same thickness as said source and drain regions.

11. The monolithic circuit of claim 8 wherein said second plurality of thin film transistors are not provided with a metal silicide region on or in contact with the source and drain regions thereof.

12. The monolithic circuit of claim 8 wherein said first plurality of thin film transistors have a larger offset gate area than said second plurality of thin film transistors.

13. The monolithic circuit of claim 8 wherein said semiconductor layer in said first plurality of thin film transistors is doped with an impurity selected from the group carbon, oxygen and nitrogen at a concentration $5\times10^{19}$–$5\times10^{21}$ atoms/cm$^3$.

14. The monolithic circuit of claim 8 wherein the gate electrode of said first plurality of thin film transistors is provided with a first oxide of the material of said gate electrode.

15. The monolithic circuit of claim 14 wherein the gate electrode of said second plurality of thin film transistors is provided with a second oxide of the material of said gate electrode, said second oxide being thinner than said first oxide.

16. A monolithic circuit comprising:

a substrate having an insulating surface, said substrate including an active matrix circuit portion and a peripheral circuit portion;

a first plurality of thin film transistors formed on the active matrix circuit portion of the substrate; and a second plurality of thin film transistors formed on the peripheral circuit portion of the substrate for driving said first plurality of thin film transistors, wherein (a) each of said first and second plurality of thin film transistors comprises a silicon semiconductor layer including source, drain and channel regions therein, metal silicide regions connected to said source and drain regions, a gate insulating layer formed on said semiconductor layer, and a gate electrode formed on said gate insulating layer and an oxide insulating layer comprising an oxide of a material of said gate electrode formed on at least side surfaces of said gate electrode; (b) each of said first and second plurality of thin film transistors is provided with side spacers formed adjacent to the side surfaces of said gate electrode with said oxide insulating layer interposed therebetween; and (c) inner edges of said metal silicide regions are substantially aligned with outer edges of said side spacers.

17. The monolithic circuit of claim 16 wherein said metal is selected from the group consisting of molybdenum (Mo), tungsten (W), platinum (Pt), chromium (Cr), titanium (Ti), and cobalt (Co).

18. The monolithic circuit of claim 16 wherein said metal silicide region has the same thickness as said source and drain regions.

19. The device of claim 1 wherein said oxide insulating layer comprises an anodic oxide of the material of said gate electrode.

20. The monolithic circuit of claim 16 wherein said first plurality of thin film transistors have a larger offset gate area than said second plurality of thin film transistors.

21. The monolithic circuit of claim 16 wherein said semiconductor in said first plurality of thin film transistors is doped with an impurity selected from the group carbon, oxygen and nitrogen at a concentration $5\times10^{19}$–$5\times10^{21}$ atoms/cm$^3$.

22. The monolithic circuit of claim 16 wherein the gate electrode of said first plurality of thin film transistors is provided with a first oxide of the material of said gate electrode.

23. The monolithic circuit of claim 22 wherein the gate electrode of said second plurality of thin film transistors is provided with a second oxide of the material of said gate electrode, said second oxide being thinner than said first oxide.

24. A semiconductor device comprising:

a substrate having an insulating surface;

a pair of p-channel thin film transistor and an n-channel thin film transistor formed on said insulating surface;

each of said p-channel and n-channel thin film transistors having a pair of impurity silicon semiconductor regions, a channel semiconductor region extending therebetween, metal silicide regions connected to said impurity silicon semiconductor regions, a gate insulating layer formed on said channel semiconductor region, a gate electrode formed on said gate insulating layer, and an oxide insulating layer comprising an oxide of a material of said gate electrode formed on at least side surfaces of said gate electrode; and one of the pair of impurity regions of said p-channel thin film transistor being electrically connected with one of the pair of impurity regions of said n-channel thin film transistors through corresponding one of said metal silicide regions formed therebetween, wherein said each of said p-channel and n-channel thin film transistors is provided with side spacers adjacent to the side surfaces of said gate electrode with said oxide insulating layer interposed therebetween, and inner edges of said metal silicide regions are substantially aligned with outer edges of said side spacers.

25. The semiconductor device of claim 24 wherein said pair of p-channel thin film transistors and a n-channel thin film transistor form a CMOS circuit.

26. The semiconductor device of claim 24 wherein an electrode is provided on said metal silicide layer.

27. The device of claim 1 wherein said source and drain regions extend between said channel region and said metal silicide regions and are substantially coextensive with said side spacers.

28. The device of claim 4 wherein said source and drain regions extend between said channel region and said metal silicide regions and are substantially coextensive with said side spacers.

29. The device of claim 24 wherein said metal silicide layer is interposed between said one of the pair of impurity regions of said p-channel thin film transistor and said one of the pair of impurity regions of said n-channel thin film transistors.

* * * * *